(12) United States Patent
Burch et al.

(10) Patent No.: US 7,904,867 B2
(45) Date of Patent: Mar. 8, 2011

(54) INTEGRATING A BOOLEAN SAT SOLVER INTO A ROUTER

(75) Inventors: Jerry R. Burch, Portland, OR (US); Robert F. Damiano, Lake Oswego, OR (US); Pei-Hsin Ho, Portland, OR (US); James H. Kukula, Hillsboro, OR (US)

(73) Assignee: Synopsys, Inc., Mountain View, CA (US)

( * ) Notice: Subject to any disclaimer, the term of this patent is extended or adjusted under 35 U.S.C. 154(b) by 731 days.

(21) Appl. No.: 11/732,848

(22) Filed: Apr. 4, 2007

(65) Prior Publication Data
US 2008/0250376 A1    Oct. 9, 2008

(51) Int. Cl.
G06F 17/50    (2006.01)
(52) U.S. Cl. ........................................ 716/130
(58) Field of Classification Search ................. 716/1–18
See application file for complete search history.

(56) References Cited

U.S. PATENT DOCUMENTS
2007/0101303 A1* 5/2007 Lien et al. .................... 716/5

OTHER PUBLICATIONS

Nam et al., "Hybrid Routing for FPGAs by Integrating Boolean Satisfiability with Geometric Search", Field-Programmable Logic and Applications: Reconfigurable Computing Is Going Mainstream, vol. 2438, pp. 360-369, 2002.*
Silva et al., "GRASP—A New Search Algorithm for Satisfiability", IEEE/ACM International Conference on Computer-Aided Design 1996, pp. 220-227.*

* cited by examiner

Primary Examiner — Vuthe Siek
Assistant Examiner — Aric Lin
(74) Attorney, Agent, or Firm — Park, Vaughan, Fleming & Dowler LLP

(57) ABSTRACT

One embodiment of the present invention provides a system that routes a set of pairs of points during the design of an integrated circuit (IC) chip. The system comprises a routing engine which is configured to search for a path to connect a current pair of points in the set of pairs of points, wherein the path comprises a set of rectangles and vertices. The routing engine uses a routing database, which keeps track of previously routed nets that can obstruct the routing of the current pair of points. The system further comprises a satisfiability (SAT) solver which is capable of solving a set of constraints, wherein the set of constraints are associated with the routability of the set of pairs of points. The SAT solver additionally comprises a SAT database which maintains the set of constraints and a current partial solution to the set of constraints. The SAT database is used to update the routing database if the current partial solution changes.

26 Claims, 5 Drawing Sheets

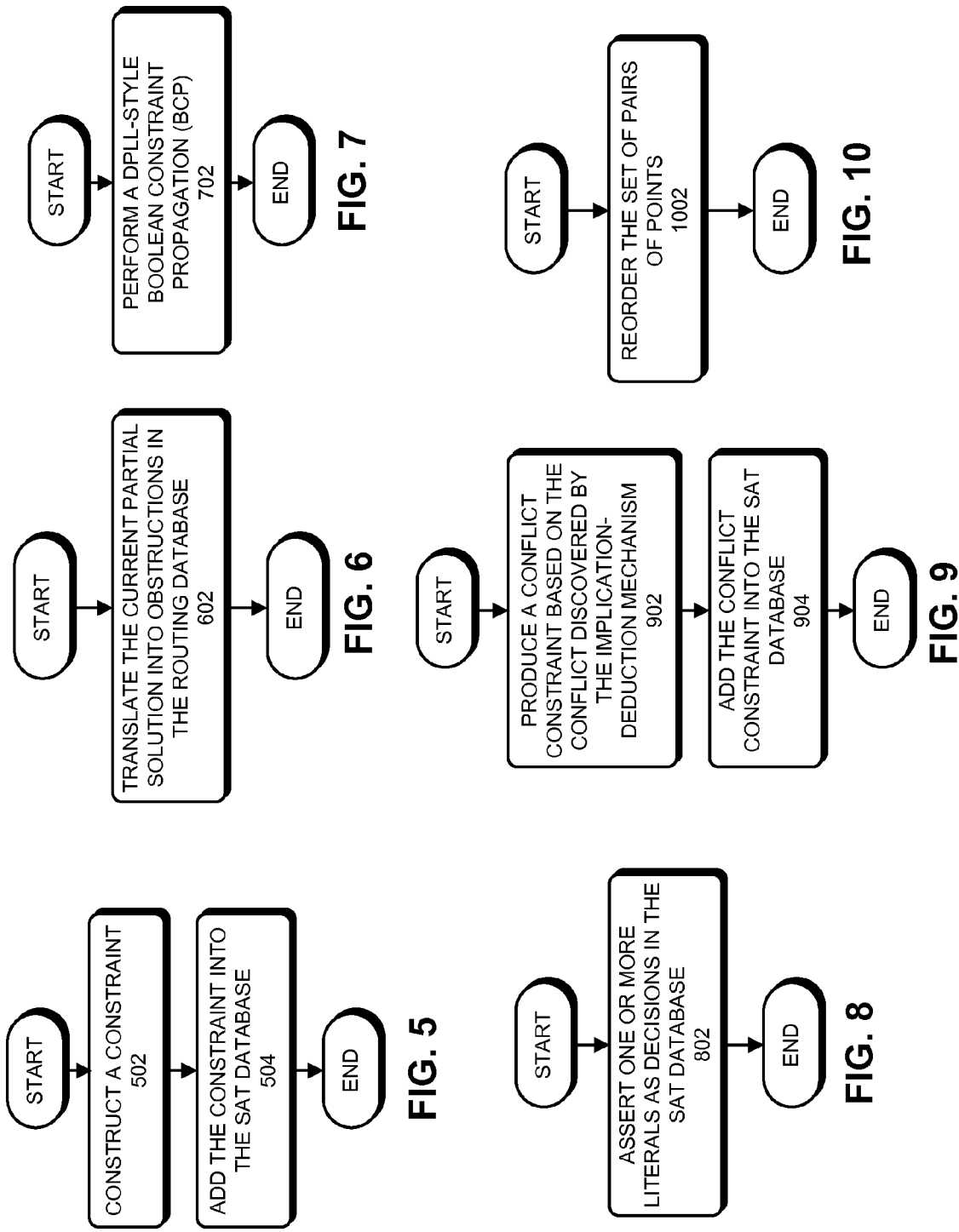

INTEGRATING A BOOLEAN SAT SOLVER INTO A ROUTER

BACKGROUND

1. Field of the Invention

The present invention relates to techniques for routing nets during the process of designing of an integrated circuit. More specifically, the present invention relates to a method and a system for integrating a Boolean Satisfiability (SAT) solver into a router to facilitate solving a complicated routing problem during the design of an integrated circuit (IC).

2. Related Art

Advances in semiconductor technology presently make it possible to integrate large-scale systems, including hundreds of millions of transistors, onto a single semiconductor chip. This dramatic increase in semiconductor integration densities has made it considerably more challenging to efficiently perform routing in such a large-scale IC chip.

Routing an integrated circuit involves determining routes for metal wires which electrically connect integrated circuit devices to produce circuits that perform desired functions. Large scale IC chips are typically routed using automatic routing software, which is typically referred to as a "routing system" or "router." A router receives a design for an IC chip which includes a "netlist" that specifies connectivity between circuit nodes. The router then determines how to route conductors through the physical layout to connect associated components on the netlist. During this process, the router adheres to a set of design rules while routing wires between circuit nodes.

A routing process generally includes a "global-routing phase," which is followed by a "detailed-routing phase." The global-routing phase determines an approximate route for the wires across the chip. In doing so, a global router typically divides the chip into rectangular tiles, and then maps the connection points to the tile centers, and subsequently routes the connections over a tile adjacency graph (also called a "global grid graph").

During the subsequent detailed-routing phase, a detailed router starts with the coarse results produced by the global router, and implements specific connections between pairs of points within a region of chip, which is referred to as a "switchbox." These connections specify with complete precision where each wire is located.

For a given pair of points, a "routing engine" is used to find a connection between those points. The resulting connection may use wires that had been routed before the routing engine was used for the given pair of points. The router determines: how each net in the netlist is decomposed into pairs of points, the order that those pairs are routed using the routing engine, and which connections should be ripped-up and rerouted, while searching for a desirable routing for each switchbox.

A maze routing engine (also referred to as a "Lee routing engine") is one type of routing engine which routes a given pair of points by progressively searching through some or all of the grid locations between the given pair of points. A maze routing engine is typically guaranteed to find a connection between the pair of points if such a connection exists. Furthermore, a maze routing engine is also capable of finding a shortest path if there is more than one possible path.

However, in some cases a router can generate a set of connections for a switchbox which fails to satisfy all of the design rules. In such cases, a user will receive feedback from the router that a design rule violation has occurred. Typically, the user will have to perform a number of actions, such as: (1) entering the routing environment, for example through a graphical user interface (GUI), locating the violating route, and attempting to fix the route by hand; or alternatively (2) returning to earlier steps of the routing flow and relaxing the design constraints by, for example, increasing the size of the area being routed. Unfortunately, such manual intervention is tedious and can slow down the routing process.

Hence, what is needed is a method and a system that can improve the routability of a router, and which can thereby release the user from the task of manually intervening in the routing process.

SUMMARY

One embodiment of the present invention provides a system that routes a set of pairs of points during the design of an integrated circuit (IC) chip. The system comprises a routing engine which is configured to search for a path to connect a current pair of points in the set of pairs of points, wherein the path comprises a set of rectangles and vertices. The routing engine uses a routing database, which keeps track of previously routed nets that can obstruct the routing of the current pair of points. The system further comprises a satisfiability (SAT) solver which is capable of solving a set of constraints, wherein the set of constraints are associated with the routability of the set of pairs of points. The SAT solver additionally comprises a SAT database which maintains the set of constraints and a current partial solution to the set of constraints. The SAT database is used to update the routing database if the current partial solution changes.

In a variation on this embodiment, the routing engine is a maze routing engine.

In a variation on this embodiment, the SAT solver further comprises a failure-diagnosis mechanism which is configured to construct a constraint if the routing engine fails to route the current pair of points and to add the constraint into the SAT database.

In a variation on this embodiment, the system represents a rectangle or a vertex in the path connecting the current pair of points by using one or more literals in the SAT solver.

In a further variation on this embodiment, the one or more literals can specify: the dimensions of the rectangle; the positions of the rectangle on the IC chip; whether the rectangle is metal; and other properties of the rectangle.

In a variation on this embodiment, the SAT database is used to update the routing database by translating the current partial solution into obstructions in the routing database, thereby allowing the routing engine to use the newly added constraints from the SAT database.

In a variation on this embodiment, the SAT solver comprises an implication-deduction mechanism, which is configured to perform a DPLL-style Boolean constraint propagation (BCP) to simplify the set of constraints.

In a further variation on this embodiment, the implication-deduction mechanism is activated if a new vertex is committed to the path connecting the current pair of points, wherein committing the new vertex involves asserting one or more literals as decisions in the SAT database.

In a further variation, the implication-deduction mechanism is further configured to discover a conflict as a result of committing the new vertex to the path connecting the current pair of points.

In a further variation, the SAT solver further comprises a conflicting-diagnosis mechanism, which is configured to produce a conflict constraint based on the conflict discovered by the implication-deduction mechanism and to add the conflict constraint into the SAT database. The conflicting-diagnosis mechanism is activated by the implication-deduction mechanism when the conflict is discovered.

In a further variation, the SAT solver further comprises a backtracking mechanism, which is configured to undo one or more existing paths routed by the routing engine. The backtracking mechanism is activated if a conflict is discovered by the implication-deduction mechanism, or if the routing engine fails to find a path to connect the current pair of points.

In a further variation, the backtracking mechanism is configured to reorder the set of pairs of points.

BRIEF DESCRIPTION OF THE FIGURES

FIG. 5 presents a flowchart that illustrates a process for constructing and adding a constraint in accordance with an embodiment of the present invention.

FIG. 6 presents a flowchart that illustrates a process for translating a current partial solution into obstructions in the routing database in accordance with an embodiment of the present invention.

FIG. 7 presents a flowchart that illustrates a process for performing Boolean constraint propagation in accordance with an embodiment of the present invention.

FIG. 8 presents a flowchart that illustrates a process for asserting one or more literals as decisions in the SAT database in accordance with an embodiment of the present invention.

FIG. 9 presents a flowchart that illustrates a process for constructing and adding a conflict constraint in accordance with an embodiment of the present invention.

FIG. 10 presents a flowchart that illustrates a process for reordering the set of pairs of points in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Integrated Circuit Design Flow

Figure 1:
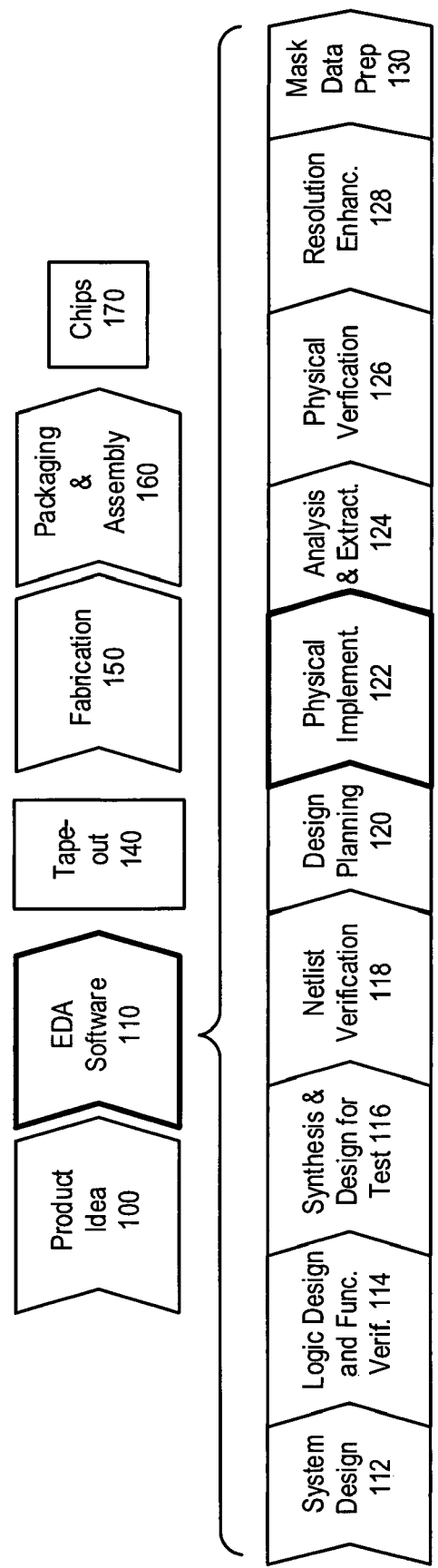
FIG. 1 illustrates various steps in the design and fabrication of an integrated circuit in accordance with an embodiment of the present invention.

FIG. 1 illustrates various steps in the design and fabrication of an integrated circuit in accordance with an embodiment of the present invention.

The process starts with the product idea (step 100) which is realized using an EDA software design process (step 110). When the design is finalized, it can be taped-out (event 140). After tape out, the fabrication process (step 150) and packaging and assembly processes (step 160) are performed which ultimately result in finished chips (result 170).

The EDA software design process (step 110), in turn, comprises steps 112-130, which are described below. Note that the design flow description is for illustration purposes only. This description is not meant to limit the present invention. For example, an actual integrated circuit design may require the designer to perform the design steps in a different sequence than the sequence described below. The following discussion provides further details of the steps in the design process.

System design (step 112): The designers describe the functionality that they want to implement. They can also perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, tests can be designed and implemented to check the finished chips. Exemplary EDA software products from Synopsys, Inc. that can be used at this step include Design Compiler®, Physical Compiler, Test Compiler, Power Compiler, FPGA Compiler, Tetramax, and DesignWare® products.

Netlist verification (step 118): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 120): Here, an overall floorplan for the chip is constructed and analyzed for timing and top-level routing. Exemplary EDA software products from Synopsys, Inc. that can be used at this step include Astro and IC Compiler products.

Physical implementation (step 122): The placement (positioning of circuit elements) and routing (connection of the same) occurs at this step. Exemplary EDA software products from Synopsys, Inc. that can be used at this step include the Astro and IC Compiler products.

Analysis and extraction (step 124): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

Physical verification (step 126): In this step, the design is checked to ensure correctness for manufacturing, electrical issues, lithographic issues, and circuitry. Exemplary EDA software products from Synopsys, Inc. that can be used at this step include the Hercules product.

Resolution enhancement (step 128): This step involves geometric manipulations of the layout to improve manufacturability of the design. Exemplary EDA software products from Synopsys, Inc. that can be used at this step include Proteus, ProteusAF, and PSMGen products.

Mask data preparation (step 130): This step provides the "tape-out" data for production of masks to produce finished chips. Exemplary EDA software products from Synopsys, Inc. that can be used at this step include the CATS® family of products.

Embodiments of the present invention can be used during one or more of the above described steps. Specifically, one embodiment of the present invention can be used during the physical implementation step 122.

Integrating a Router and a Boolean Satisfiability Solver: Overview

A typical Boolean satisfiability (SAT) solver (hereafter a "SAT solver") receives a logical formula involving a set of Boolean variable inputs and determines whether or not there exists a combination of these inputs which causes a single Boolean output to be 1 or "TRUE" (i.e., "satisfied"). Note that it is equally important to determine whether there is no such combination of Boolean input assignments which causes the output to be 1.

A typical SAT formula is expressed in a clausal form referred to as a conjunctive normal form (CNF), i.e., as an AND of one or more OR terms. In this form, each OR term comprises one or more variables (or the negation of a variable) in a logical disjunction which is referred to as a "clause." A clause is effectively a constraint on a set of possible assignments of the associated variables. Hence, to allow the output of the SAT formula to be satisfied, each of the clauses has to be satisfied. In other words, all the constraints have to be simultaneously satisfied. Note that each Boolean variable (or the negation of a Boolean variable) within a clause is also referred to as a "literal."

The process of searching for a SAT solution typically involves a backtracking search. Specifically, the SAT solver first assumes a variable or a set of variables have given value (s) to cause the output value of 1, i.e., to satisfy the formula. Such an assumption of a variable assignment is referred to as a "decision." The SAT solver may later determine that under the given decision, there exists no solution to the SAT problem, or that any solution would require that a variable with an assignment to be assigned to an opposite value. This process of determining that there is no solution based on a current decision or having to change an assumption is referred to as "backtracking."

In one embodiment of the present invention, to enhance the routability of the routing process, a routing engine is integrated with a SAT solver ("an integrated solver" hereafter). Note that both a routing engine and a SAT solver are configured to search for a solution under a given set of constraints. Specifically, a routing engine is configured to search for a path to connect a given pair of points specified by a given netlist, wherein the path has to navigate through a set of obstacles (constraints). On the other hand, a SAT solver is a potentially powerful search technique for handling interactions between different connections. For example, when the routing process encounters a design rule violation, instead of asking a user to manually fix the problem, an integrated solver can automatically activate a backtracking process, which returns to a point where a new path can be found to avoid causing the design rule violation.

Figure 4:
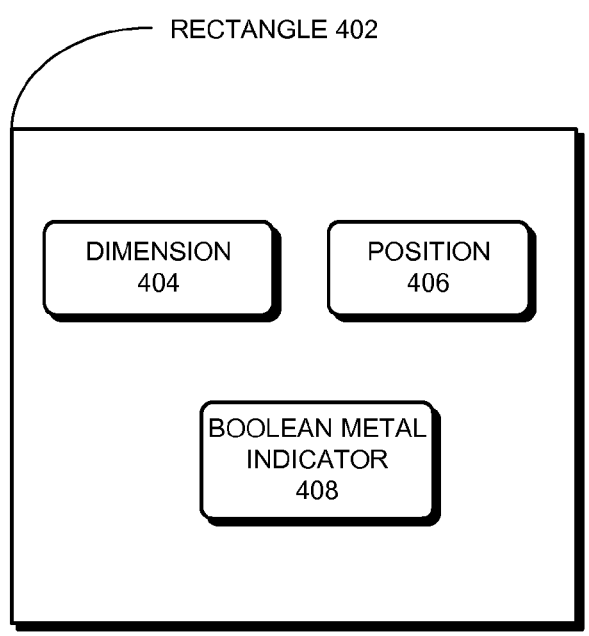
FIG. 4 illustrates a rectangle and a corresponding set of properties of the rectangle in accordance with an embodiment of the present invention.

Note that a SAT solver operates in a Boolean space, wherein all the constraints are represented by clauses, which are disjunctions of a set of literals. These literals are smallest units in the SAT solver. In contrast, a router searches for placements of a set of rectangles on an IC chip, wherein a rectangle is a smallest unit in a routing problem. FIG. 4 illustrates a rectangle 402 and a corresponding set of properties of rectangle 402. As illustrated in FIG. 4, rectangle 402 can have multiple properties, including, but not limited to: a dimension 404, a position 406, and a Boolean value representing whether or not it is metal 408. A rectangle in a routing problem may be represented by one or more literals in the SAT solver. Alternatively, this can be achieved by enriching the SAT solver to understand non-Boolean variables in a routing problem.

Note that a SAT solver possesses clause-learning abilities which can discover new constraints to be added to a SAT database as new clauses. These new clauses can facilitate reducing the number unknowns in the current partial solution and hence reducing the search space of a SAT problem. In one embodiment of the present invention, the integrated routing engine and SAT solver can discover conflicts during a routing engine process and can express the resulting constraints as new clauses into a SAT database.

We describe in detail components and information flow between the components within an integration of a routing engine and a SAT solver below. In doing so, we will focus on a maze routing engine. However, the general technique for integrating a router and a SAT solver can be applied to other routing engines, including, but are not limited to a channel router or an area router.

State Diagram for an Integrated Solver

Figure 2:
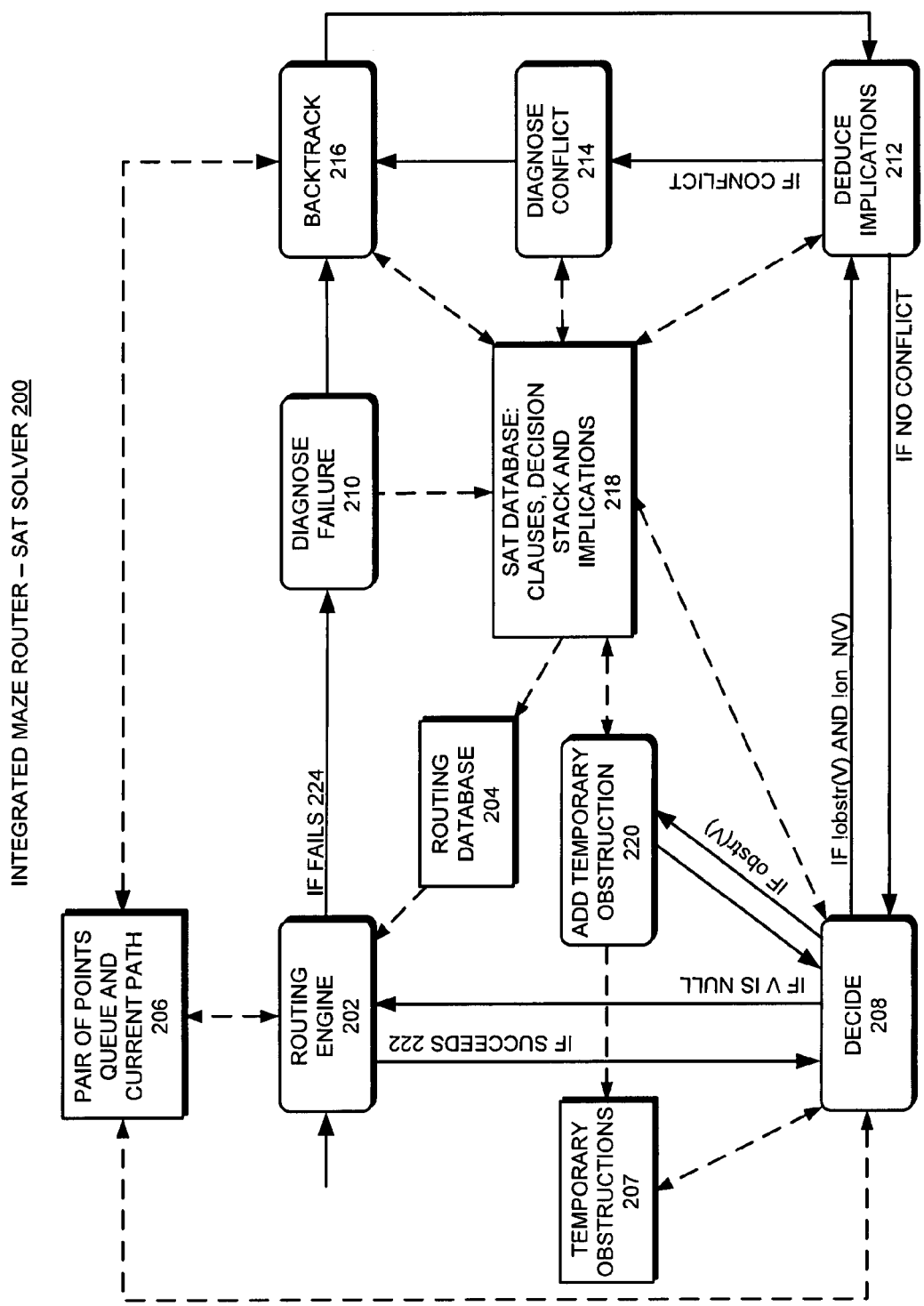
FIG. 2 illustrates a state machine diagram of an integrated routing engine and SAT solver in accordance with an embodiment of the present invention.

FIG. 2 illustrates a state machine diagram of an integrated routing engine and SAT solver 200 in accordance with an embodiment of the present invention. Note that there are primarily two types of boxes in this diagram: (1) boxes with rounded corners represent states which perform one or more specific functions in the integrated solver; (2) boxes with non-rounded corners represent databases/repositories which store information associated with one or more of the states.

One of the states of the integrated solver in FIG. 2 is a routing engine state 202. Routing engine state 202 is generally associated with a conventional maze routing engine, which is configured to search for a path between a given pair of points during a routing process within a given switchbox. Note that the given pair of points are to be connected to the same net. During operation, routing engine state 202 communicates with routing database 204, which stores previously routed connections that can potentially obstruct the routing of a current pair of points.

Routing engine state 202 is also coupled to Pair of Points Queue and Current Path ("pair queue" hereafter) 206, wherein pair queue 206 is an information repository storing the following information:

Pair of Points Queue—Q: a list of all the pairs of points needed to be connected. It is effectively a "to do" list in the integrated solver and needs to be solved on per pair of points basis. Typically, Q is associated with the set of pairs of points within a switchbox;

Current Pair of Points—S: the current pair of points being routed by the integrated solver. We use next(S) and prev(S) to denote the pairs of points following and preceding S in Q;

Current Path—P: produced by the routing engine state 202, it comprises a set of vertices that forms a path connecting the current pair of points S;

Current net—N: the net that the points in S are on, wherein the connectivity is specified in the netlist;

Current vertex—V: current vertex in a set of vertices that forms the path P connecting the current pair of points S. We use next(V) and prev(V) to denote vertices following and preceding V in P.

Temporary Obstructions 207 is an information repository storing T, a set of vertices. The integrated solver may temporarily add obstructions to the SAT database for the purpose of guiding the routing engine. The set of vertices T associated with those obstructions is stored in Temporary Obstructions 207. The set T of vertices is initially empty.

Five of the seven states in FIG. 2 are associated with a conventional SAT solver. They include: decide state 208, diagnose failure state 210, deduce implication state 212, diagnose conflict state 214, and backtrack state 216. Note that all above five states are coupled to SAT database 218. In one embodiment of the present invention, SAT database 218 is a standard Davis-Putnam-Longemann-Loveland (DPLL)-style SAT solver database, which typically comprises a set of clauses, a decision stack, and a list of variable assignments.

Note that FIG. 2 includes two types of directed arrows. A single-ended arrow indicates a unidirectional transition, whereas a double-ended arrow indicates bidirectional transitions.

Arrows between states (with solid lines) represent state transitions. In contrast, arrows between a state and a database/repository (with dotted lines) represent information flow. For example, information can flow from a database/repository into a state and can influence the transition out of the state. Additionally, information can flow from a state into a database/repository to allow information to be recorded.

Information can also flow between the databases. Note that the information flow between routing database 204 and SAT database 218 is unidirectional (from SAT database 218 to routing database 204). In one embodiment of the present invention, this information flow keeps the two databases synchronized by translating new decisions and implications which are added to SAT database 218 into new obstructions in routing database 204 that routing engine state 202 understands.

Note that FIG. 2 further comprises a set of conditions for state transitions. Because a state can transition into more than one other state, the set of conditions are used to determine conditions under which a state makes a transition to another state. We now describe functionality of states and transitions between states in more detail below.

Routine Engine State

Routing engine state 202 is the only state in the integrated solver that is inherent to a conventional router. Routing engine state 202 attempts to produce a path P that connects two points in a given pair of points S. In one embodiment of the present invention, a conventional maze routing engine is used and the routing process considers obstructions specified in routing database 204. In one embodiment, routing engine state 202 can transition to another state under two conditions:

"If succeeds" condition 222: Specifically, if routing engine state 202 can find a path P connection S which satisfies constraints in routing database 204, then routing engine state 202 transitions to decide state 208. In one embodiment, prior to making this transition, routing engine state 202 sets V to be the first vertex in P, or in pseudo code V:=head(P). This step initializes global variable V so that it can be used in decide state 208;

"If fails" condition 224: Under this condition, e.g., if routing engine state 202 fails to find a path P which satisfies constraints in routing database 204, routing engine state 202 transitions to diagnose failure state 210 which performs a failure analysis.

Decide State

In decide state 208, each of the vertices in the newly produced path P is examined. Note that when a path P is generated from routing engine state 202, the integrated solver does not commit to use P until it has examined and determined that P also satisfies the set of clauses within SAT database 218. If so, the integrated solver commits P to the solution (potentially subject to future backtracking) and returns to routing engine state 202 to route the next pair of points next(S). More specifically, examining a path P against SAT database involves examining each vertex in the path P to ensure it is consistent with the SAT database. To illustrate how decide state 208 operates, we introduce two new conditions:

Condition on_N(V) is TRUE iff a current vertex V is already being used in the current net N. For example, if two vertices $V_1$ and $V_2$ has been previously connected on net N, and a next vertex $V_3$ is found to be on the path between $V_1$ and $V_2$, then on_N($V_3$) is TRUE.

Condition obstr(V) is TRUE iff V is being used for some other net or is otherwise obstructed. Note that because two different nets are not allowed to cross each other, this condition is used to detect and avoid two nets sharing a common vertex. For example, after vertex $V_A$ has been used in a current path $P_A$ on net $N_A$, it may then be discovered (for example, by implication) that vertex $V_B$ has to be used in another net $N_B$ because of $V_A$. Assume, however, $V_B$ has already been used on net $N_A$. Consequently, we obtain a logical disjunctive constraint that net $N_A$ cannot use both $V_A$ and $V_B$.

We now look at a number of different cases involved in decide state 208 and how they are handled by decide state 208.

If V is in the set T of temporary obstructions 207:
If obstr(V): In this case, the temporary obstruction represented by V is already reflected in the SAT database 218, and the system returns from decide state 208 to routing engine state 202 (as shown in FIG. 2).
If !obstr(V): This condition indicates that the SAT database 218 should be updated to indicate that the current vertex V is an obstruction. In this case, decide state 208 asserts one or more literals L to imply obstr(V) in SAT database 218. In one embodiment of the present invention, each new literal L is asserted as a decision onto the decision stack in database 218. Additionally, decide state 208 makes a state transition to the next state: deduce implications state 212. Note that deduce implications state 212 is activated when a new decision can cause potential conflict in subsequent decisions.

If V≠NULL && on_N(V): In this case, decide state 208 simply moves on to the next V in P (i.e., V:=next(V)).

If V=NULL:
If the set T of temporary obstructions 207 is empty: This condition indicates that all the vertices in P have been examined, and the system returns from decide state 208 to routing engine state 202 (as shown in FIG. 2) and the current pair of points is stepped forward to the next pair of points in Q (i.e., S:=next(S)).
If the set T of temporary obstruction 207 is not empty: This condition also indicates that all the vertices in P have been examined. However, before continuing to the next pair of points, it is necessary to remove the temporary obstructions in T. More specifically, the system pops decisions (and any resulting implications) off the stack for all vertices in the current path P and all temporary obstructions in T, the current vertex is reset to the first vertex in P (i.e., V:=head(P)), and T is reset to contain the empty set of vertices. Finally, the system remains in decide state 208.

If obstr(V): In this situation, the path P, together with the connections already made, is not consistent with any complete solution. Temporary obstructions 207 will be used to guide the routing engine to produce a different path. In this case, decide state 208 transitions into add temporary obstruction state 220.

If V is not in the set T of temporary obstructions 207, and !obstr(V) and !on_N(V): This condition indicates current vertex V is a legitimate choice for path P and vertex V has also caused current net N to extend (through adding a new edge). In this case, decide state 208 commits V to path P by asserting one or more literals L to imply on_N(V) in SAT database 218. In one embodiment of the present invention, each new literal L is asserted as a decision onto the decision stack in database 218. Additionally, decide state 208 makes a state transition to the next state: deduce implications state 212. Note that deduce implications state 212 is activated when a new decision can cause potential conflict in subsequent decisions.

Deduce Implications State

In one embodiment of the present invention, deduce implications state 212 performs a DPLL-style Boolean constraint propagation (BCP) to discover literals implied by the current partial solution reflected in SAT database 218. For example, a BCP technique can perform unit clause propagation. Note that a unit clause is a clause comprising a set of literals wherein all but one literal are false. For example, if L is the literal that is not false in a unit clause in the SAT database, BCP can update the SAT database to indicate that L has the value TRUE.

Note that combining the implication deduction capability of a SAT solver with the routing engine effectively adds heuristic learning to the routing engine. When a new decision is made in decide state 208, a new literal L is asserted in the SAT database. The DPLL technique subsequently examines this assertion and attempts to discover any implications that result from this assertion. In one embodiment of the present invention, an implication discovered by the DPLL can result in a "conflict" condition. For example, as a result of committing vertex V in path $P_1$, an implication may indicate that a next path $P_2$ may become un-routable. This conflict condition cannot be detected by a standalone routing engine prior to routing path $P_2$.

FIG. 3 illustrates an exemplary process of routing a set of pairs of points that causes a conflict condition in accordance with an embodiment of the present.

Figure 3A:
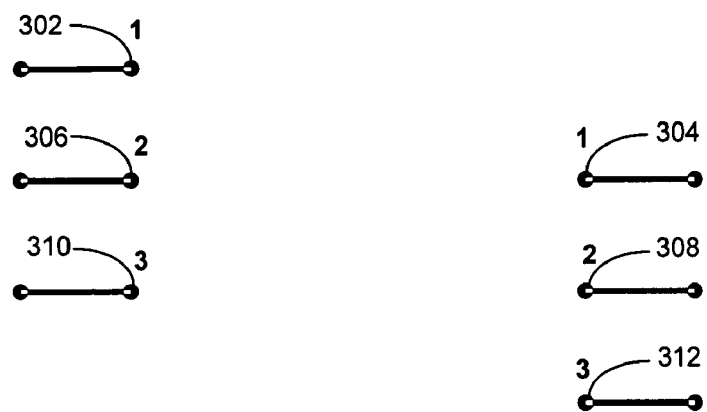
FIG. 3A illustrates the initial state during the process of routing three pairs of points in accordance with an embodiment of the present invention.

FIG. 3A illustrates the initial state during the process of routing three pairs of points in accordance with an embodiment of the present. Note that pair of points 1 includes points 302 and 304, pair of points 2 includes points 306 and 308, and pair of points 3 includes points 310 and 312. Points 302, 306, and 310 are one grid distance apart from each other in the vertical direction on the left, and similarly points 304, 308, and 312 are one grid distance apart from each other in the vertical direction on the right.

Figure 3B:
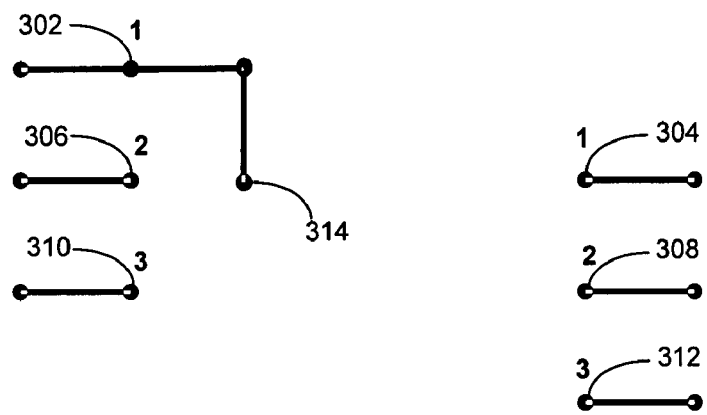
FIG. 3B illustrates how a partial route of pair 1 causes a conflict in routing pair 2 in accordance with an embodiment of the present invention.

FIG. 3B illustrates how a partial route of pair of points 1 causes a conflict in routing pair of points 2 in accordance with an embodiment of the present. Note that because vertex 314 is included in this partial route, pair of points 2 becomes un-routable. Hence, the implication of committing vertex 314 while routing pair of points 1 is a conflict condition, which indicates that the partial route of pair of points 1 is not consistent with any complete solution for routing all three pairs of points.

Figure 3C:
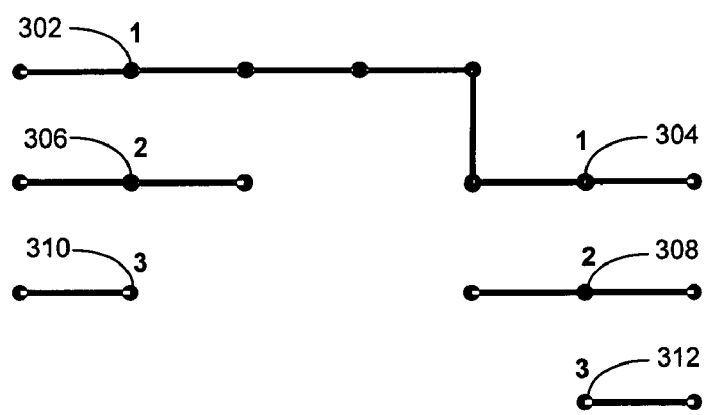
FIG. 3C illustrates an implication deduced from the unsuccessful partial route of pair 1 in FIG. 3B in accordance with an embodiment of the present invention.

FIG. 3C illustrates an implication deduced from the unsuccessful partial route of pair of points 1 in FIG. 3B in accordance with an embodiment of the present. Note that even though the routing sequence may not begin with pair of points 2, the implication of the configuration in FIG. 1 is that both points 306 and 308 in pair of points 2 have to be extended horizontally to avoid design rule violations. As a result of this implication, additional constraints are implied for routing pair of points 1, which will ensure that the routing for pair of points 1 will satisfy a complete solution which successfully routes all three pairs of points. FIG. 3 illustrates a possible route for pair of points 1 under these new constraints.

Deduce implications state 212 is capable of discovering such a potential conflict. If a conflict is discovered, deduce implications state 212 transitions into diagnose conflict state 214 and activates a conflict diagnosis process to generate new constraints. Otherwise, if no conflict is found, deduce implications state 212 returns to decide state 208, which then continues to examine the next V (i.e., V:=next(V)) in current path P. Note, however, that deduce implications state 212 is also capable of discovering non-conflict implications. For example, an implication can include an assertion of a literal in SAT database 218.

Diagnosis Conflict State

In one embodiment of the present invention, diagnosis conflict state 214 is configured to construct a new conflict clause based on the discovery of a conflict by deduce implication state 212 and to add the new conflict clause to SAT database 218. When such a conflict clause in SAT database 218 is later used in deduce implications state 212, the integrated solver guarantees that the same conflict condition is avoided. For example, if deduce implications state 212 needs to make a choice between setting a variable X to either 1 or 0, an existing conflict clause can force X to be 1 (or 0), based on the learning from encountering the same situation earlier.

In one embodiment, upon completing its operation, diagnose conflict state 214 automatically transitions to a backtrack state 216, which is configured to undo one or more of the decisions made in the previous steps.

Note that by combing the learning mechanism of deduce implications state 212 and diagnose conflict state 214, more conflict conditions can be averted, which reduces the number of backtracking operations that are required.

Backtrack State

In one embodiment of the present invention, backtrack state 216 is reached when the integrated solver has discovered that some decisions that have been made are not consistent with a "complete solution." One entry point to this state is when deduce implications state 212 discovers a conflict, produces a conflict clause, and subsequently activates backtrack state 216 (for example, through diagnose conflict state 214). Another entry point to backtrack state 216 arises from diagnose failure state 210. We discuss this second entry point below.

In one embodiment of the present invention, backtrack state 216 is configured to "undo" some of the decisions which are already made. Specifically, backtrack state 216 pops decisions off the decision stack in SAT database 218 until the corresponding conflict clause is no longer falsified.

In the integrated solver, backtracking involves popping a partial current path or an entire current path P which is already routed from the decision stack. In another embodiment, if some but not all of the decisions associated with routing a current pair of points have been popped from the decision stack, backtracking continues to pop the rest of the decisions for that pair of points. In another embodiment, backtracking can go further back to remove the current path P and one or more previously routed paths of the proceeding pairs of points.

Reordering the Pair of Points Queue Q

Note that the efficiency of solving a routing problem depends on the order of the set of pairs of points queue Q. A more efficient pair of points queue order, which leads to less backtracking can significantly speed up the routing process. In one embodiment of the present invention, after some paths have been undone through backtracking, backtrack state 216 is further configured to reorder the pair of points queue Q to improve the routing efficiency. In particular, the pair of points that caused the failure that triggered backtracking can be moved earlier or later in the queue depending on the specific heuristic. Furthermore, backtrack state 216 also causes pair of points queue 206 to update the new queue order and the new current path. These updates are then used in routing engine state 202 and decide state 208 accordingly.

A number of options exist for reordering. In one embodiment, the current (problematic) pair of points can be moved to follow the last pair of points that remains routed after backtracking. In another embodiment of the present invention, the problematic pair of points can be moved a random number of pairs earlier than the last routed pair of points. Adding some degree of randomness in the reordering process can reduce the possibility of getting into an infinite loop of failures. Consequently, some previously routed pairs of points which used to be earlier in the queue but became later than the reordered pair of points, may have to be popped off the decision stack. Note that in addition to using this randomization to avoid the failure loop, the ability to add new clauses into SAT database 218 can also help to avoid repeating the same routing failure.

Upon completing the backtracking process, backtrack state 216 returns to deduce implications state 212.

Diagnose Failure State

If routing engine state 202 fails to find a path for the current pair of points P (condition 224), it transitions to diagnose failure state 210. In one embodiment of the present invention, diagnose failure state 210 is configured to determine a subset of the obstructions in the routing database that make the current pair of points un-routable.

More specifically, during routing engine state 202, the routing engine keeps track of obstructions encountered during the path search. By the time the routing of the current pair of points fails, the router has recorded all the obstructions (a set of vertices) it has encountered during the search, and can pass them to diagnose failure state 210. Next, diagnose failure state 210 can produce an obstruction clause from the set of obstructions. Diagnose failure state 210 then adds the obstruction clause to SAT database 218. Hence, during a subsequent routing process, partial solutions with the set of obstructions specified by the obstruction clause will be avoided.

Next, diagnose failure state 210 exits and transitions to backtrack state 216 as mentioned earlier, which invokes a backtracking process to return to an earlier pair of points in the pair of points queue.

Add Temporary Obstruction State

In add temporary obstruction state 220, a vertex V is added to the set T of temporary obstructions 207. In addition, all decisions for vertices in the current path P are popped off the decision stack of SAT database 218. Next, add temporary obstruction state 220 exits and transitions to decide state 208.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defines by the appended claims.

What is claimed is:

1. A system that routes electrical connections during the design of an integrated circuit (IC) chip, comprising:
   a routing engine configured to search for a current path to electrically connect a current pair of points in a set of pairs of points;
   a routing database used by the routing engine, which keeps track of objects that can obstruct the routing of the current pair of points; and
   a satisfiability (SAT) solver capable of solving a set of constraints, which are associated with the routability of the set of pairs of points, wherein the SAT solver includes a SAT database which maintains the set of constraints and a current partial solution to the set of constraints, wherein the SAT database is configured to update the routing database if the current partial solution changes, and wherein the routing engine invokes the SAT solver to examine the current path before searching for a next path to electrically connect a next pair of points in the set of pairs of points.

2. The system of claim 1, wherein the routing engine is a maze routing engine.

3. The system of claim 1, wherein the SAT solver further comprises a failure diagnosis mechanism configured to:
   construct a constraint if the routing engine fails to route the current pair of points; and
   add the constraint into the SAT database.

4. The system of claim 1, wherein the current path comprises a set of rectangles, wherein a rectangle in the path is represented by one or more literals in the SAT solver.

5. The system of claim 4, wherein the SAT solver further comprises an implication deduction mechanism which is configured to perform a DPLL-style Boolean constraint propagation (BCP) to simplify the set of constraints.

6. The system of claim 5, wherein the implication deduction mechanism is activated if a new vertex is committed to a path connecting the current pair of points, wherein committing the new vertex involves asserting one or more literals as decisions in the SAT database.

7. The system of claim 6, wherein the implication deduction mechanism is further configured to discover a conflict as a result of committing the new vertex to the path connecting the current pair of points.

8. The system of claim 7, wherein the SAT solver further comprises a conflicting diagnosis mechanism which is configured to:
   produce a conflict constraint based on the conflict discovered by the implication-deduction mechanism; and
   add the conflict constraint into the SAT database,
   wherein the conflicting diagnosis mechanism is activated by the implication deduction mechanism when the conflict is discovered.

9. The system of claim 7, wherein the SAT solver further comprises a backtracking mechanism, which is configured to undo one or more existing paths routed by the routing engine, wherein the backtracking mechanism is activated if:
   a conflict is discovered by the implication deduction mechanism; or if
   the routing engine fails to find a path to connect the current pair of points.

10. The system of claim 9, wherein the backtracking mechanism is configured to reorder the set of pairs of points.

11. The system of claim 1, wherein the SAT database updates the routing database to keep the SAT database and the routing database synchronized, thereby allowing the routing engine to use newly added constraints from the SAT database.

12. A method for routing electrical connections during the design of an integrated circuit (IC) chip, comprising:
using at least one computer for:
searching for a current path to electrically connect a current pair of points in a set of pairs of points using a routing engine, wherein the routing engine uses a routing database to keep track of objects that can obstruct the routing of the current pair of points; and
enhancing the routability of the set of pairs of points by using a satisfiability (SAT) solver capable of solving a set of constraints which are associated with the routability of the set of pairs of points, wherein the SAT solver includes a SAT database which maintains the set of constraints and a current partial solution to the set of constraints, wherein the SAT database is configured to update the routing database if the current partial solution changes, and wherein the routing engine invokes the SAT solver to examine the current path before searching for a next path to electrically connect a next pair of points in the set of pairs of points.

13. The method of claim 12, wherein the routing engine is a maze routing engine.

14. The method of claim 12, wherein enhancing the routability by using the SAT solver involves:
performing a failure diagnosis to construct a constraint if the routing engine fails to route the current pair of points; and
adding the constraint into the SAT database.

15. The method of claim 12, wherein the current path comprises a set of rectangles, wherein a rectangle in the path is represented by one or more literals in the SAT solver.

16. The method of claim 15, wherein enhancing the routability by using the SAT solver involves performing a DPLL-style Boolean constraint propagation (BCP) to simplify the set of constraints in the SAT database.

17. The method of claim 16, wherein the method further comprises performing the DPLL-style BCP if a new vertex is committed to a path connecting the current pair of points, wherein committing the new vertex involves asserting one or more literals as decisions in the SAT database.

18. The method of claim 17, wherein the method further comprises discovering a conflict as a result of committing the new vertex to the path connecting the current pair of points.

19. The method of claim 18, wherein if the conflict is discovered, the method further comprises:
producing a conflict constraint based on the discovered conflict; and
adding the conflict constraint into the SAT database.

20. The method of claim 18, wherein enhancing the routability by using the SAT solver involves performing a backtracking using the SAT solver to undo one or more existing paths routed by the routing engine if:
a conflict is discovered as a result of committing the new vertex; or
the routing engine fails to find a path to connect the current pair of points.

21. The method of claim 20, wherein the method further comprises reordering the set of pairs of points.

22. The method of claim 12, wherein enhancing the routability involves updating the routing database to keep the SAT database and the routing database synchronized, thereby allowing the routing engine to use newly added constraints from the SAT database.

23. A computer readable storage medium storing instructions that when executed by a computer cause the computer to perform a method for routing electrical connections during the design of an integrated circuit (IC) chip, the method comprising:
searching for a current path to electrically connect a current pair of points in a set of pairs of points using a routing engine, wherein the routing engine uses a routing database which keeps track of objects that can obstruct the routing of the current pair of points; and
enhancing the routability of the set of pairs of points by using a satisfiability (SAT) solver capable of solving a set of constraints which are associated with the routability of the set of pairs of points, wherein the SAT solver includes a SAT database which maintains the set of constraints and a current partial solution to the set of constraints, wherein the SAT database is configured to update the routing database if the current partial solution changes, and wherein the routing engine invokes the SAT solver to examine the current path before searching for a next path to electrically connect a next pair of points in the set of pairs of points.

24. The computer readable storage medium of claim 23, wherein the routing engine is a maze routing engine.

25. The computer readable storage medium of claim 23, wherein enhancing the routability by using the SAT solver involves:
performing a failure diagnosis to construct a constraint if the routing engine fails to route the current pair of points; and
adding the constraint into the SAT database.

26. The computer readable storage medium of claim 23, wherein enhancing the routability involves updating the routing database to keep the SAT database and the routing database synchronized, thereby allowing the routing engine to use newly added constraints from the SAT database.

* * * * *